(12) United States Patent
Zhao et al.

(10) Patent No.: US 12,099,268 B2
(45) Date of Patent: Sep. 24, 2024

(54) SPLICED DISPLAY PANEL AND SPLICED DISPLAY DEVICE

(71) Applicant: TCL CHINA STAR OPTOELECTRONICS TECHNOLOGY CO., LTD., Shenzher (CN)

(72) Inventors: Jun Zhao, Shenzhen (CN); Juncheng Xiao, Shenzhen (CN); Yongping Fan, Shenzhen (CN)

( * ) Notice: Subject to any disclaimer, the term of this patent is extended or adjusted under 35 U.S.C. 154(b) by 0 days.

(21) Appl. No.: 17/614,348

(22) PCT Filed: Nov. 22, 2021

(86) PCT No.: PCT/CN2021/132117
§ 371 (c)(1),
(2) Date: Nov. 25, 2021

(87) PCT Pub. No.: WO2023/082318
PCT Pub. Date: May 19, 2023

(65) Prior Publication Data
US 2024/0027812 A1    Jan. 25, 2024

(30) Foreign Application Priority Data

Nov. 10, 2021 (CN) .......................... 202111323022.8

(51) Int. Cl.
G02F 1/1333 (2006.01)
G02F 1/1335 (2006.01)
(Continued)

(52) U.S. Cl.
CPC .... *G02F 1/13336* (2013.01); *G02F 1/133512* (2013.01); *G02F 1/1339* (2013.01);
(Continued)

(58) Field of Classification Search
CPC .......... H05K 2201/10136; H05K 2201/10106; H05K 2201/056; H05K 2201/055; H05K 1/118; H05K 5/0021; H05K 1/189; H01L 25/0753; G02F 1/1339; G02F 1/133512; G02F 1/13336
See application file for complete search history.

(56) References Cited

U.S. PATENT DOCUMENTS

2016/0266437 A1* 9/2016 Liu .................... G02F 1/133524
2018/0173036 A1* 6/2018 Kim .................. G02F 1/133524
(Continued)

FOREIGN PATENT DOCUMENTS

CN  104464557 A  3/2015
CN  105845036 A  8/2016
(Continued)

*Primary Examiner* — Mariam Qureshi

(57) ABSTRACT

A spliced display panel and a spliced display device are provided. At least two display panels are spliced to form a gap. The light-emitting diode substrate is disposed between two adjacent display panels. The first supporting portion of the light-emitting diode substrate is disposed on one of the display panels, and the second supporting portion of the light-emitting diode substrate is disposed on another one of the display panels. The carry portion is disposed on the first supporting portion and the second supporting portion to shield the gap.

18 Claims, 3 Drawing Sheets

(51) Int. Cl.
*G02F 1/1339* (2006.01)
*G02F 1/335* (2006.01)
*H01L 25/075* (2006.01)
*H05K 1/18* (2006.01)
*H05K 5/00* (2006.01)
*H05K 1/11* (2006.01)

(52) U.S. Cl.
CPC ......... *H01L 25/0753* (2013.01); *H05K 1/189* (2013.01); *H05K 5/0021* (2013.01); *H05K 1/118* (2013.01); *H05K 2201/055* (2013.01); *H05K 2201/056* (2013.01); *H05K 2201/10106* (2013.01); *H05K 2201/10136* (2013.01)

(56) References Cited

U.S. PATENT DOCUMENTS

2019/0155076 A1\* 5/2019 Cheng ............... G02F 1/133308
2024/0126111 A1\* 4/2024 Zhou ................ G02F 1/133317

FOREIGN PATENT DOCUMENTS

| CN | 106842711 A | 6/2017 |
| CN | 108205970 A | 6/2018 |
| CN | 111290154 A | 6/2020 |

\* cited by examiner

SPLICED DISPLAY PANEL AND SPLICED DISPLAY DEVICE

FIELD OF INVENTION

The present application relates to display technologies, and more particularly, to a spliced display panel and a spliced display device.

BACKGROUND OF INVENTION

During the research and practice of the prior art, the inventor of the present application found that with the rapid development of the outdoor display market, large size and high resolution have become a development direction of outdoor displays. The traditional liquid crystal display panel (LCD) is not only low in cost, but also high in resolution. However, as a spliced screen, it cannot eliminate gaps and affect a visual effect. Further, the sub-millimeter-level light-emitting diode (Mini LED) panel and the micro-LED panel are still immature in a small pitch, the resolutions of Mini-LED and Micro-LED are not as good as the resolution of the LCD, and the cost is also too high. Therefore, solving the gap problem of LCD splicing screens has become a key breakthrough point that needs to be solved urgently.

SUMMARY OF INVENTION

The present application provides a spliced display panel and a spliced display device, which can visually eliminate a gap between display panels caused by the splicing.

The present application provides a spliced display panel, including:
- at least two display panels, wherein the at least two display panels are spliced to form a gap; and
- a light-emitting diode substrate comprising a flexible circuit board and a plurality of light-emitting diodes, wherein the flexible circuit board includes a carry portion, a first bending portion, a second bending portion, a first supporting portion, and a second supporting portion, and wherein the plurality of light-emitting diodes are disposed on the carry portion, a side of the carry portion is connected to the first bending portion, the first bending portion is connected to the first supporting portion, another side of the carry portion is connected to the second bending portion, and the second bending portion is connected to the second supporting portion;
- wherein the first supporting portion and the second supporting portion are partially overlapped the carry portion respectively; and
- wherein the light-emitting diode substrate is disposed between two adjacent display panels, the first supporting portion of the light-emitting diode substrate is disposed on one of the display panels, the second supporting portion of the light-emitting diode substrate is disposed on another one of the display panels, and the carry portion of the light-emitting diode substrate is disposed on the first supporting portion and the second supporting portion, and shields the gap.

Among them, the light-emitting diode substrates are disposed on the two display panels, and the gaps are shielded, so as to achieve a purpose of eliminating the gaps visually. In addition, the light-emitting diode substrate adopts a manner of bending on both sides, and the first supporting portion and the second supporting portion are used to support the carry portion, thereby a flatness of the arrangement of the supporting portion and the light-emitting diodes can be improved.

Optionally, in some embodiments of the present application, the flexible circuit board further includes an extension portion connected to the first supporting portion and/or the second supporting portion, wherein the extension portion is disposed in the gap; and wherein the spliced display panel further includes a driving device, and the extension portion is electrically connected to the driving device.

Optionally, in some embodiments of the present application, the extension portion includes a first extension portion and a second extension portion, wherein the first extension portion is connected to the first supporting portion, the second extension portion is connected to the second supporting portion, and the first extension portion and the second extension portion are disposed in the gap; and
- wherein the driving device further includes a first driving device and a second driving device, wherein the first extension portion is electrically connected to the first driving device, and the second extension portion is electrically connected to the second driving device, wherein the two extension portion are used to connect two driving device, which reduces a load of the driving device.

Optionally, in some embodiments of the present application, the flexible circuit board further includes a plurality of first traces and a plurality of second traces, and the plurality of light-emitting diodes includes a plurality of first light-emitting diodes and a plurality of second light-emitting diodes, wherein the first traces are connected to the first light emitting diodes, and the second traces is connected to the second light emitting diodes, and
- wherein the first traces extend from the carry portion to the first extension portion, and the second traces extend from the carry portion to the second extension portion, therefore, a distance between the plurality of light-emitting diodes can be reduced, and the resolution of the light-emitting diode substrate can be improved.

Optionally, in some embodiments of the present application, the plurality of light-emitting diodes includes a plurality of first light-emitting diodes and a plurality of second light-emitting diodes, and the carry portion is provided with a first region and a second region, wherein the second region is disposed on both sides of the first region, the plurality of first light-emitting diodes are disposed in the first region, and the plurality of second light-emitting diodes are disposed in the second region; and
- a light-emitting brightness of the first light-emitting diode is greater than a light-emitting brightness of the second light-emitting diode, and the light-emitting brightness of the second light-emitting diode is greater than a light-emitting brightness of the display panel, to make the luminous brightness of the display panel and the light-emitting diode substrate tend to be consistent, thereby improving the display effect.

Optionally, in some embodiments of the present application, the extension portion is connected to the first supporting portion, and the second bending portion and the second support portion are both formed of non-metallic materials, wherein because the second bending portion and the second supporting portion are made of non-metallic materials, an effect of saving materials and improving a bending performance can be achieved Optionally, in some embodiments of the present application, the extension portion and the driving device are plugged disposed or bonded disposed by conductive glue, so as to realize a connection between the extension portion and the driving device.

Optionally, in some embodiments of the present application, the flexible circuit board further includes a first golden finger and a second golden finger, wherein the first golden finger is positioned at a terminal of the first extension portion, the second golden finger is positioned at a terminal of the second extension portion, and wherein the first golden finger is connected to the first traces, and the second golden finger is connected to the second traces; and wherein the first golden finger of the first extension portion is plug-fitted with the first driving device, and the second golden finger of the second extension portion is plug-fitted with the second driving device.

Optionally, in some embodiments of the present application, the spliced display panel further includes a first colloid, a second colloid, a third colloid, and a fourth colloid, wherein the first colloid is disposed between the carry portion and the first supporting portion, the second colloid is disposed between the carry portion and the second supporting portion, the third colloid is disposed between the first supporting portion and the display panel, and the fourth colloid is disposed between the second supporting portion and the display panel, and wherein the colloid is used to connect the carry portion, the supporting portion, and the display panel to achieve thinning effect.

Optionally, in some embodiments of the present application, the display panel includes a display region and a non-display region, and the carry portion is correspondingly disposed in the non-display region;
wherein the display panel further includes a light-shielding layer, and the light-shielding layer is disposed in the non-display region and partially overlapped with the carry portion.

Optionally, in some embodiments of the present application, the display panel includes a first substrate, a second substrate, and liquid crystal disposed between the first substrate and the second substrate, wherein the light-shielding layer is disposed between the first substrate and the second substrate and is configured to encapsulate the liquid crystal, and wherein the light-shielding layer comprises a sealant and light-shielding particles doped in the sealant, so as to simplify the process and improve the display contrast of the light-emitting diode substrate.

Correspondingly, the present application also relates to a spliced display device including a backlight module and the spliced display panel, the backlight module being arranged on a light incident side of the display panel;
the spliced display panel comprising:
at least two display panels, wherein the at least two display panels are spliced to form a gap; and
a light-emitting diode substrate comprising a flexible circuit board and a plurality of light-emitting diodes, wherein the flexible circuit board comprises a carry portion, a first bending portion, a second bending portion, a first supporting portion, and a second supporting portion, and wherein the plurality of light-emitting diodes are disposed on the carry portion, a side of the carry portion is connected to the first bending portion, the first bending portion is connected to the first supporting portion, another side of the carry portion is connected to the second bending portion, and the second bending portion is connected to the second supporting portion;

wherein the first supporting portion and the second supporting portion are partially overlapped the carry portion respectively; and
wherein the light-emitting diode substrate is disposed between two adjacent display panels, the first supporting portion of the light-emitting diode substrate is disposed on one of the display panels, the second supporting portion of the light-emitting diode substrate is disposed on another one of the display panels, and the carry portion of the light-emitting diode substrate is disposed on the first supporting portion and the second supporting portion and shields the gap.

Among them, the light-emitting diode substrates are disposed on the two display panels, and the gaps are shielded, so as to achieve a purpose of eliminating the gaps visually. In addition, the light-emitting diode substrate adopts a manner of bending on both sides, and the first supporting portion and the second supporting portion are used to support the carry portion, thereby a flatness of the arrangement of the supporting portion and the light-emitting diodes can be improved.

Optionally, in some embodiments of the present application, the flexible circuit board further includes an extension portion connected to the first supporting portion and/or the second supporting portion, wherein the extension portion is disposed in the gap; and
wherein the spliced display panel further includes a driving device, and the extension portion is electrically connected to the driving device.

Optionally, in some embodiments of the present application, the extension portion includes a first extension portion and a second extension portion, wherein the first extension portion is connected to the first supporting portion, the second extension portion is connected to the second supporting portion, and the first extension portion and the second extension portion are disposed in the gap; and
wherein the driving device further includes a first driving device and a second driving device, wherein the first extension portion is electrically connected to the first driving device, and the second extension portion is electrically connected to the second driving device, wherein the two extension portion are used to connect two driving device, which reduces a load of the driving device.

Optionally, in some embodiments of the present application, the flexible circuit board further includes a plurality of first traces and a plurality of second traces, and the plurality of light-emitting diodes includes a plurality of first light-emitting diodes and a plurality of second light-emitting diodes, wherein the first traces are connected to the first light emitting diodes, and the second traces is connected to the second light emitting diodes, and
wherein the first traces extend from the carry portion to the first extension portion, and the second traces extend from the carry portion to the second extension portion, therefore, a distance between the plurality of light-emitting diodes can be reduced, and the resolution of the light-emitting diode substrate can be improved.

Optionally, in some embodiments of the present application, the plurality of light-emitting diodes includes a plurality of first light-emitting diodes and a plurality of second light-emitting diodes, and the carry portion is provided with a first region and a second region, wherein the second region is disposed on both sides of the first region, the plurality of first light-emitting diodes are disposed in the first region, and the plurality of second light-emitting diodes are disposed in the second region; and a light-emitting brightness of the first light-emitting diode is greater than a light-emitting brightness of the second light-emitting diode, and the light-emitting brightness of the second light-emitting diode is greater than a light-emitting brightness of the display panel, to make the luminous brightness of the display panel and the light-emitting diode substrate tend to be consistent, thereby improving the display effect.

Optionally, in some embodiments of the present application, the extension portion is connected to the first supporting portion, and the second bending portion and the second support portion are both formed of non-metallic materials, wherein because the second bending portion and the second supporting portion are made of non-metallic materials, an effect of saving materials and improving a bending performance can be achieved Optionally, in some embodiments of the present application, the extension portion and the driving device are plugged disposed or bonded disposed by conductive glue, so as to realize a connection between the extension portion and the driving device.

Optionally, in some embodiments of the present application, the flexible circuit board further includes a first golden finger and a second golden finger, wherein the first golden finger is positioned at a terminal of the first extension portion, the second golden finger is positioned at a terminal of the second extension portion, and wherein the first golden finger is connected to the first traces, and the second golden finger is connected to the second traces; and wherein the first golden finger of the first extension portion is plug-fitted with the first driving device, and the second golden finger of the second extension portion is plug-fitted with the second driving device.

Optionally, in some embodiments of the present application, the spliced display panel further includes a first colloid, a second colloid, a third colloid, and a fourth colloid, wherein the first colloid is disposed between the carry portion and the first supporting portion, the second colloid is disposed between the carry portion and the second supporting portion, the third colloid is disposed between the first supporting portion and the display panel, and the fourth colloid is disposed between the second supporting portion and the display panel, and wherein the colloid is used to connect the carry portion, the supporting portion, and the display panel to achieve thinning effect.

Optionally, in some embodiments of the present application, the display panel includes a display region and a non-display region, and the carry portion is correspondingly disposed in the non-display region;

wherein the display panel further includes a light-shielding layer, and the light-shielding layer is disposed in the non-display region and partially overlapped with the carry portion.

Optionally, in some embodiments of the present application, the display panel includes a first substrate, a second substrate, and liquid crystal disposed between the first substrate and the second substrate, wherein the light-shielding layer is disposed between the first substrate and the second substrate and is configured to encapsulate the liquid crystal, and wherein the light-shielding layer comprises a sealant and light-shielding particles doped in the sealant, so as to simplify the process and improve the display contrast of the light-emitting diode substrate.

The spliced display panel of the embodiment of the present application includes at least two display panels are spliced and disposed to form a gap. The light-emitting diode substrate includes a flexible circuit board and a plurality of light-emitting diodes. The flexible circuit board includes a carry portion, a first bending portion, a second bending portion, a first supporting portion, and a second supporting portion. The plurality of light-emitting diodes are disposed on the carry portion. A side of the carry portion is connected to the first bending portion, the first bending portion is connected to the first supporting portion, and the other side of the bending portion is connected to the second bending portion. The second bending portion is connected to the second supporting portion, the first supporting portion and the second supporting portion are disposed partially overlap the carry portion respectively. The light-emitting diode substrate is disposed between two adjacent display panels. The first supporting portion of the light-emitting diode substrate is disposed on one of the display panels, the second supporting portion of the light-emitting diode substrate is disposed on the other one of the display panels. The carry portion of the light-emitting diode substrate is disposed on the first supporting portion and the second supporting portion, and the carry portion shields the gap.

The spliced display panel of the embodiment of the present application provides light-emitting diode substrates disposed on two display panels to shield the gap to achieve a purpose of visually eliminating the gap. In addition, the light-emitting diode substrate uses a design of bending on both sides, and the first supporting portion and the second supporting portion are used to support the supporting portion, thereby improving a flatness of the arrangement of the supporting portion and the light-emitting diodes.

DESCRIPTION OF FIGURES

In order to explain the technical solutions in the embodiments of the present application more clearly, the following will briefly introduce the figures needed in the description of the embodiments. Obviously, the figures in the following description are only some embodiments of the present application. For those skilled in the art, without inventive steps, other figures can be obtained based on these figures.

DETAILED DESCRIPTION OF EMBODIMENTS

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application. In addition, it should be understood that the specific implementations described here are only used to illustrate and explain the present application, and are not used to limit the present application. In the present application, unless otherwise stated, the directional words used such as "upper" and "lower" generally refer to the upper and lower directions of the device in actual use or working state, and specifically refer to the figure directions in the figures. And "inner" and "outer" refer to the outline of the device.

The embodiments of the present application provide a spliced display panel and a spliced display device, which will be described in detail below. It should be noted that an order of description in the following embodiments is not meant to limit a preferred order of the embodiments.

Figure 1:
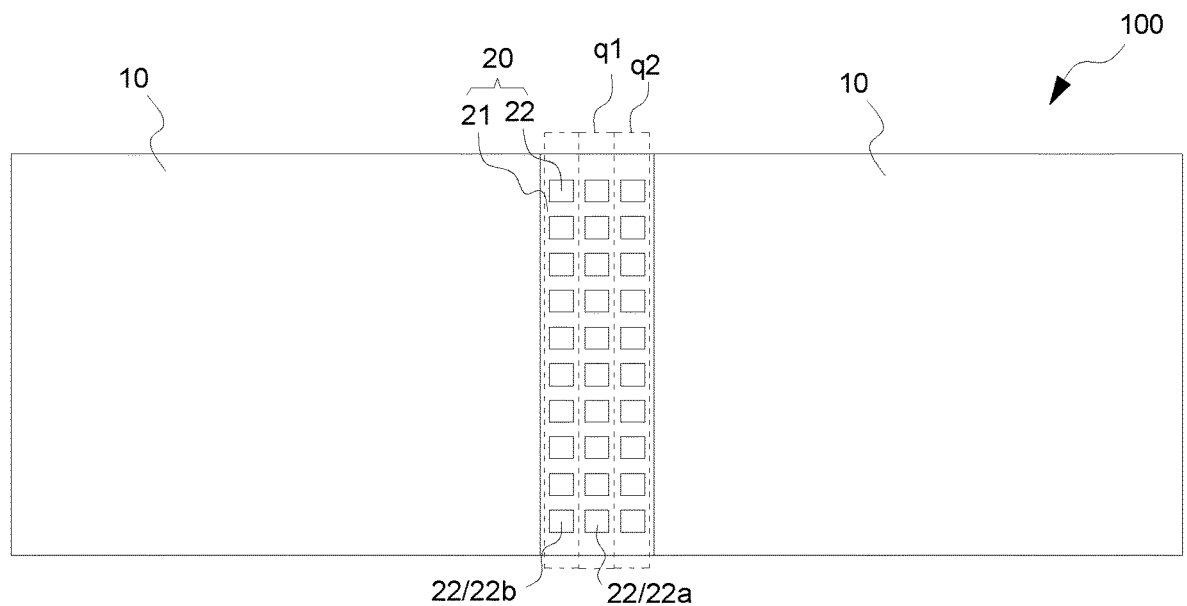
FIG. 1 is a schematic diagram of a front view structure of a spliced display panel provided by one embodiment of the present application.
Figure 2:
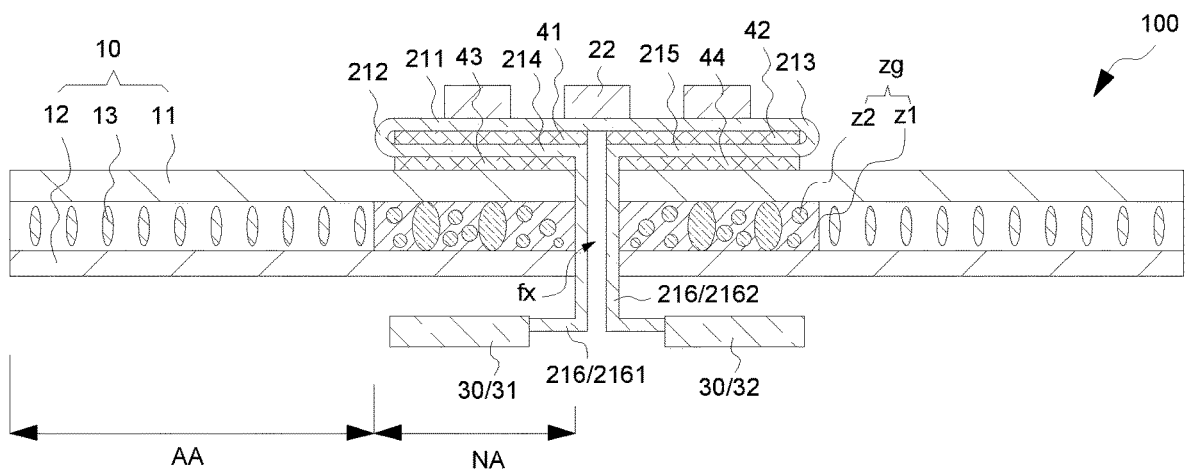
FIG. 2 is a schematic diagram of a first cross-sectional structure of the spliced display panel provided by one embodiment of the present application.

Referring to FIGS. 1 and 2, one embodiment of the present application provides a spliced display panel 100, which includes a display panel 10 and a light-emitting diode substrate 20.

At least two display panels 10 are spliced to form a gap fx.

The light-emitting diode substrate 20 includes a flexible circuit board 21 and a plurality of light-emitting diodes 22. The flexible circuit board 21 includes a supporting portion 211, a first bending portion 212, a second bending portion 213, a first supporting portion 214, and a second supporting portion 215. The light-emitting diode 22 is disposed on the carry portion 211. One side of the supporting portion 211 is connected to the first bending portion 212, and the first bending portion 212 is connected to the first supporting portion 214. The other side of the supporting portion 211 is connected to the second bending portion 213. The second bending portion 213 is connected to the second supporting portion 215. The first supporting portion 214 and the second supporting portion 215 are partially overlapped with the supporting portion 211 respectively.

The light-emitting diode substrate 20 is disposed between two adjacent display panels 10, the first supporting portion 214 of the light-emitting diode substrate 20 is disposed on one display panel 10. The second supporting portion 215 of the light-emitting diode substrate 20 is disposed on the other display panel 10. The carry portion 211 of the light-emitting diode substrate 20 is disposed on the first supporting portion 214 and the second supporting portion 215, and shields the gap fx.

The spliced display panel 100 of the embodiment of the present application adopts the light-emitting diode substrate 20 to be disposed on the two display panels 10, and shields the gap fx, to achieve a purpose of eliminating the gap visually. In addition, the light-emitting diode substrate 20 adopts a manner of bending on both sides. The first supporting portion 214 and the second supporting portion 215 support the supporting portion 211, thereby improving a flatness of the arrangement of the supporting portion 211 and the light-emitting diodes 22.

Optionally, the display panel 10 may be a liquid crystal display panel or an electroluminescent diode panel, such as OLED or QLED.

Optionally, the flexible circuit board 21 further includes an extension portion 216. The extension portion 216 is connected to the first support portion 214 and/or the second support portion 215. The extension portion 216 is provided in the gap fx.

The spliced display panel 100 further includes a driving device 30. The extension portion 216 is electrically connected to the driving device 30.

In a first structure of the spliced display panel 100 of the embodiment of the present application, there are two extension portions 216, one extension portion 216 is connected to the first support portion 214, and the other extension portion 216 is connected to the second support portion 215.

Of course, in some embodiments, a number of the extension portion 216 may also be one, and the extension portion 216 is connected to the first support portion 214 or the second support portion 215. For example, the second structure of the spliced display panel 100 in the embodiment of the present application.

Optionally, the extension portion 216 includes a first extension portion 2161 and a second extension portion 2162. The first extension portion 2161 is connected to the first support portion 214. The second extension portion 2162 is connected to the second support portion 215. The first extension portion 2161 and the second extension portion 2162 are disposed in the gap fx.

The driving device 30 further includes a first driving device 31 and a second driving device 32. The first extension portion 2161 is electrically connected to the first driving device 31. The second extension portion 2162 is electrically connected to the second driving device 32.

The spliced display panel 100 of the present application adopts the first driving device 31 and the second driving device 32 to reduce a load of the driving device.

Figure 3:
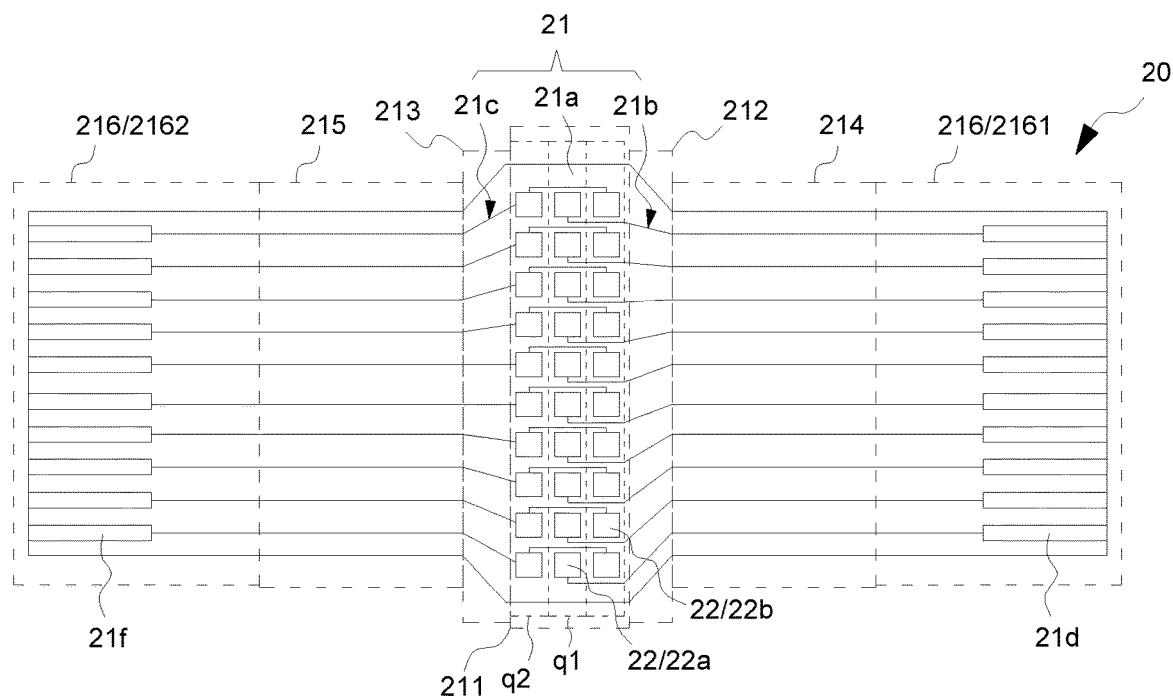
FIG. 3 is a first front view structural schematic diagram of the light-emitting diode substrate of the spliced display panel provided in one embodiment of the present application in a flat state.

Optionally, referring to FIG. 3, the flexible circuit board 21 further includes a substrate 21a and a plurality of first traces 21b and a plurality of second traces 21c provided on the substrate 21a. The light-emitting diodes 22 include a plurality of first light-emitting diodes 22a and a plurality of second light-emitting diodes 22b. The first traces 21b are connected to the first light-emitting diodes 22a. The second traces 21c are connected to the second light-emitting diodes 22b.

The first traces 21b extend from the carry portion 211 to the first extension portion 2161. The second traces 21c extend from the carry portion 211 to the second extension portion 2162.

The spliced display panel 100 of this embodiment adopts a dual-line of traces form, which saves traces space compared to a single-line trace manner, so that more light-emitting diodes 22 can be arranged in a unit area, thereby reducing a space between the light-emitting diodes 22.

That is to say, the spliced display panel 100 of this embodiment adopts the method of double-sided bending and double-sided traces, which improves the flatness of the display surface of the light-emitting diodes 22, and can be advantageous and reduce the spacing between the light-emitting diodes 22, and thus, a resolution of the light-emitting diode substrate 20 can be improved.

Optionally, a material of the substrate 21a includes one of silicon dioxide, polyethylene, polypropylene, polystyrene, polylactic acid, polyethylene terephthalate, polyimide, or polyurethane.

Optionally, referring to FIGS. 1 and 3, the carry portion 211 is provided with a first region q1 and a second region q2, and the second region q2 is provided on both sides of the first region q1. The first light-emitting diode 22a is disposed in the first region q1. The second light-emitting diode 22b is disposed in the second area q2.

A light-emitting brightness of the first light-emitting diode 22a is greater than a light-emitting brightness of the second light-emitting diode 22b. The light-emitting brightness of the second light-emitting diode 22b is greater than a light-emitting brightness of the display panel 10.

The first traces 21b are electrically connected to the first driving device 31, and the second traces 21c are electrically connected to the second driving device 32.

The light-emitting diode substrate 20 of the present application adopts a partition driving method, so that the light-emitting diode substrate 20 emits light in a partition. It is understandable that because the light-emitting brightness of the display panel 10 and the light-emitting diode substrate 20 are different, the light-emitting diode substrate 20 is visually brighter when displaying images. The partitioned driving of the light-emitting diode substrate 20 makes the light-emitting brightness of the display panel 10, the second region q2, and the first region q1 tend to be gradual, which improves the display effect.

Optionally, a resolution of the light-emitting diode substrate 20 is equal to a resolution of the display panel 10, the display effects of the light-emitting diode substrate and the display panel 10 tend to be consistent.

Optionally, the extension portion 216 is plugged and arranged with the driving device 30, or is arranged by bonding with conductive glue.

Referring to FIGS. 2 and 3, in the spliced display panel 100 of this embodiment, the flexible circuit board 21 further includes a first golden finger 21d and a second golden finger 21f. The first golden finger 21d is positioned at a terminal of the first extension portion 2161. The second golden finger 21f is positioned at a terminal of the second extension portion 2162. The first golden finger 21d is connected to the first traces 21b, and the second golden finger 21f is connected to the second traces 21c.

The first golden finger 21d of the first extension portion 2161 is plug-fitted with the first driving device 31. The second golden finger 21f of the second extension portion 2162 is plug-fitted with the second driving device 32. An insertion arrangement of the extension portion 216 and the driving device 30 facilitates an assembly and disassembly of the two.

Optionally, the spliced display panel 100 further includes a first colloid 41, a second colloid 42, a third colloid 43, and a fourth colloid 44. The first colloid 41 is disposed between the supporting portion 211 and the first supporting portion 214. The second colloid 42 is disposed between the supporting portion 211 and the second supporting portion 215. The third colloid 43 is disposed between the first supporting portion 214 and the display panel 10. The fourth colloid 44 is disposed between the second supporting portion 215 and the display panel 10.

In this embodiment, glue is used to fix a shape of the flexible circuit board 21 in a bent state, and to fix the flexible circuit board 21 on the display panel 10, to achieve an effect of thinning.

Optionally, the display panel 10 includes a display region AA and a non-display region NA. The supporting portion 211 is correspondingly disposed in the non-display region NA.

The display panel 10 includes a light-shielding layer zg, and the light-shielding layer zg is disposed in the non-display region NA and partially overlapped with the carry portion 211. The light-shielding layer zg is used to overlap the carry portion 211, that is, the black light-shielding layer zg is used as a background of the light-emitting diodes 22, thereby improving a contrast of the light-emitting diode substrate 20 when displaying images.

Optionally, the display panel 10 includes a first substrate 11, a second substrate 12, and liquid crystal 13 disposed between the first substrate 11 and the second substrate 12. The light shielding layer zg is provided between the first substrate 11 and the second substrate 12 and encapsulates the liquid crystal 13. The light-shielding layer zg includes a sealant z1 and light-shielding particles z2 doped in the sealant z1.

The light-shielding particles z2 can be used to support the first substrate 11 and the second substrate 12.

In some embodiments, the light shielding layer zg may also be a black matrix layer in the second substrate 12.

In this embodiment, the light-shielding layer zg is formed by doping the light-shielding particles z2 with the sealant z1, which saves process steps, and the light-shielding layer zg realizes an effect of encapsulating the liquid crystal 13 and provides a black background for the light-emitting diode substrate 20. A function of supporting the first substrate 11 and the second substrate 12 can be achieved.

Figure 4:
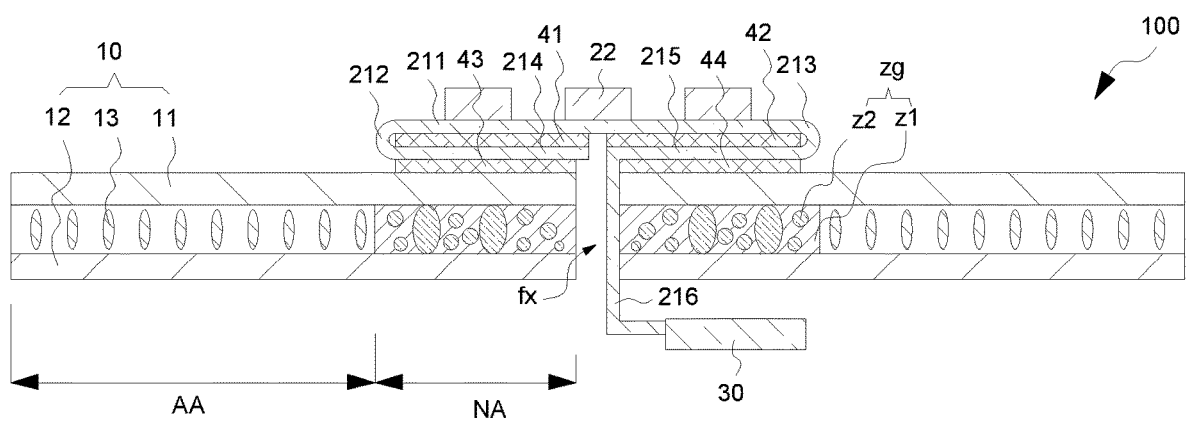
FIG. 4 is a schematic diagram of a second cross-sectional structure of the spliced display panel provided by one embodiment of the present application.
Figure 5:
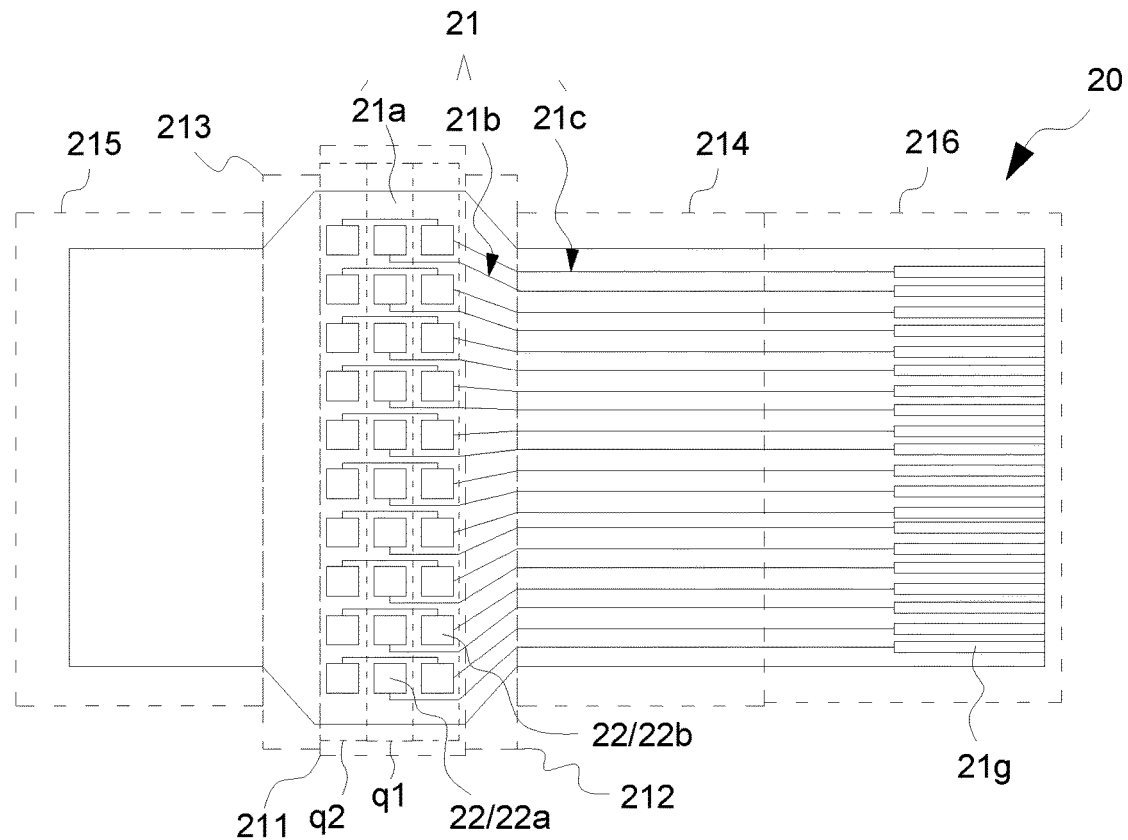
FIG. 5 is a schematic diagram of a second front view structure of the light-emitting diode substrate of the spliced display panel provided in one embodiment of the present application in the flat state.

Referring to FIGS. 4 and 5, compared with the first structure of the spliced display panel 100 of the foregoing embodiment, the spliced display panel 100 of the second structure is different from the spliced display panel 100 of the first structure in that:

the extension portion 216 is connected to the first supporting portion 214, and the second bending portion 213 and the second supporting portion 215 are both made of non-metallic materials.

In other words, the flexible circuit board 21 adopts a single-sided traces structure, and the first traces 21b and the second traces 21c of the flexible circuit board 21 both extend from the carry portion 211 to the extension portion 216.

The flexible circuit board 21 further includes a golden finger 21g, which is connected to the first traces 21b and the second traces 21c. The golden finger 21g is positioned at the extension portion 216. The golden finger 21g of the extension portion 216 is plug-in-fitted with the driving device 30.

Because the spliced display panel 100 of the second structure adopts the traces form of single-sided traces, the second bending portion 213 and the second supporting portion 215 may not be provided with metal traces, thereby saving materials and improving the bending performance of the second bending portion 213.

Figure 6:
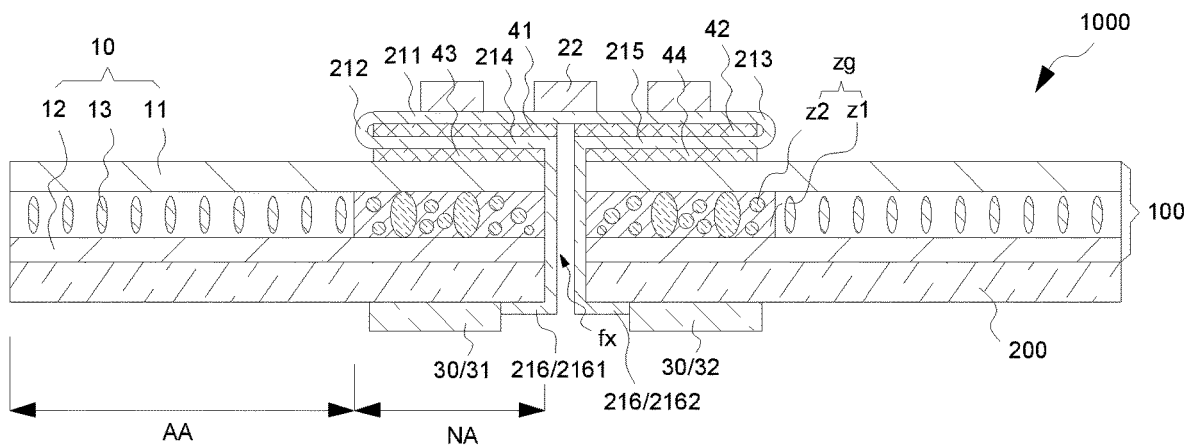
FIG. 6 is a schematic structural diagram of a splicing display device provided by one embodiment of the present application.

Referring to FIG. 6, a corresponding embodiment of the present application also provides a spliced display device 1000, which includes the spliced display panel 100 of the above-mentioned embodiment and a backlight module 200. The backlight module 200 is disposed on a light incident side of the display panel 100.

The driving device 30 is disposed on a side of the backlight module 200 away from the display panel 100.

It should be noted that the spliced display device 1000 of the embodiment of the present application takes the first structure of the spliced display panel 100 as an example for description, but is not limited to this.

The spliced display device 1000 of the embodiment of the present application includes at least two display panels 10, and the at least two display panels 10 are spliced to form a gap fx. The light-emitting diode substrate 20 includes a flexible circuit board 21 and a plurality of light-emitting diodes 22. The flexible circuit board 21 includes a carry portion 211, a first bending portion 212, a second bending portion 213, a first supporting portion 214, and a second supporting portion 215. The light-emitting diode 22 is disposed on the carry portion 211. One side of the supporting portion 211 is connected to the first bending portion 212. The first bending portion 212 is connected to the first supporting portion 214. Another side of the supporting portion 211 is connected to the second bending portion 213. The second bending portion 213 is connected to the second supporting portion 215. The first supporting portion 214 and the second supporting portion 215 are disposed partially overlap the supporting portion 211 respectively. In two adjacent display panels 10, the first supporting portion 214 is disposed on one display panel 10, the second supporting portion 215 is disposed on another display panel 10. The supporting portion 211 is disposed on the first supporting portion 214 and the second supporting portion 215, and shields the gap fx.

The spliced display device 1000 of the embodiment of the present application adopts the light-emitting diode substrate 20 to be arranged on the two display panels 10, and shields the gap fx, so as to achieve a purpose of eliminating the gap visually. In addition, the light-emitting diode substrate 20 adopts a manner of bending on both sides, and the first supporting portion 214 and the second supporting portion 215 support the supporting portion 211, thereby improving a flatness of the arrangement of the supporting portion 211 and the light-emitting diodes 22.

The splicing display panel and splicing display device provided by the embodiments of the application are described in detail above. Specific examples are used in this article to explain the principles and implementations of the present application. The descriptions of the above embodiments are only used to help understanding the method of the present application and its core idea. At the same time, for those skilled in the art, according to the idea of the present application, there will be changes in the specific implementation and the scope of the present application. In summary, a content of this specification should not be understood a limitation on the present application.

What is claimed is:

1. A spliced display panel, comprising:
   at least two display panels, wherein the at least two display panels are spliced to form a gap; and
   a light-emitting diode substrate comprising a flexible circuit board and a plurality of light-emitting diodes, wherein the flexible circuit board comprises a carry portion, a first bending portion, a second bending portion, a first supporting portion, and a second supporting portion, and wherein the plurality of light-emitting diodes are disposed on the carry portion, a side of the carry portion is connected to the first bending portion, the first bending portion is connected to the first supporting portion, another side of the carry portion is connected to the second bending portion, and the second bending portion is connected to the second supporting portion;
   wherein the first supporting portion and the second supporting portion are partially overlapped with the carry portion respectively; and
   wherein the light-emitting diode substrate is disposed between two adjacent display panels, the first supporting portion of the light-emitting diode substrate is disposed on one of the display panels, the second supporting portion of the light-emitting diode substrate is disposed on another one of the display panels, and the carry portion of the light-emitting diode substrate is disposed on the first supporting portion and the second supporting portion and shields the gap,
   wherein the spliced display panel further comprises a first colloid, a second colloid, a third colloid, and a fourth colloid, the first colloid is disposed between the carry portion and the first supporting portion, the second colloid is disposed between the carry portion and the second supporting portion, the third colloid is disposed between the first supporting portion and the display panel, and the fourth colloid is disposed between the second supporting portion and the display panel,
   wherein the flexible circuit board further comprises an extension portion, the extension portion comprises a first extension portion and a second extension portion, the first extension portion is connected to the first supporting portion, the second extension portion is connected to the second supporting portion, and the first extension portion and the second extension portion are spaced from each other in the gap.

2. The spliced display panel according to claim 1, wherein the spliced display panel further comprises a driving device, and the extension portion is electrically connected to the driving device.

3. The spliced display panel according to claim 2, wherein the driving device further comprises a first driving device and a second driving device, wherein the first extension portion is electrically connected to the first driving device, and the second extension portion is electrically connected to the second driving device.

4. The spliced display panel according to claim 3, wherein the flexible circuit board further comprises a plurality of first traces and a plurality of second traces, and the plurality of light-emitting diodes comprises a plurality of first light-emitting diodes and a plurality of second light-emitting diodes, wherein the first traces are connected to the first light emitting diodes, and the second traces are connected to the second light emitting diodes, and
   wherein the first traces extend from the carry portion to the first extension portion, and the second traces extend from the carry portion to the second extension portion.

5. The spliced display panel according to claim 4, wherein the flexible circuit board further comprises a first golden finger and a second golden finger, wherein the first golden finger is positioned at a terminal of the first extension portion, the second golden finger is positioned at a terminal of the second extension portion, and wherein the first golden finger is connected to the first traces, and the second golden finger is connected to the second traces; and
   wherein the first golden finger of the first extension portion is plug-fitted with the first driving device, and the second golden finger of the second extension portion is plug-fitted with the second driving device.

6. The spliced display panel according to claim 2, wherein the plurality of light-emitting diodes comprise a plurality of first light-emitting diodes and a plurality of second light-emitting diodes, and the carry portion is provided with a first region and a second region, wherein the second region is disposed on both sides of the first region, the plurality of first light-emitting diodes are disposed in the first region, and the plurality of second light-emitting diodes are disposed in the second region, and
   a light-emitting brightness of the first light-emitting diode is greater than a light-emitting brightness of the second light-emitting diode, and the light-emitting brightness of the second light-emitting diode is greater than a light-emitting brightness of the display panel.

7. The spliced display panel according to claim 2, wherein the extension portion is connected to the first supporting portion, and the second bending portion and the second support portion are both made of non-metallic materials.

8. The spliced display panel according to claim 1, wherein the display panel comprises a display region and a non-display region, and the carry portion is correspondingly disposed in the non-display region, wherein the display panel further comprises a light-shielding layer, and the light-shielding layer is disposed in the non-display region and partially overlapped with the carry portion.

9. The spliced display panel according to claim 8, wherein the display panel comprises a first substrate, a second substrate, and liquid crystal disposed between the first substrate and the second substrate, wherein the light-shielding layer is disposed between the first substrate and the second substrate and is configured to encapsulate the liquid crystal, and wherein the light-shielding layer comprises a sealant and light-shielding particles doped in the sealant.

10. A spliced display device, comprising a backlight module and a spliced display panel, wherein the backlight module is disposed on a light incident side of the display panel,
the spliced display panel comprising:
at least two display panels, wherein the at least two display panels are spliced to form a gap; and
a light-emitting diode substrate comprising a flexible circuit board and a plurality of light-emitting diodes, wherein the flexible circuit board comprises a carry portion, a first bending portion, a second bending portion, a first supporting portion, and a second supporting portion, and wherein the plurality of light-emitting diodes are disposed on the carry portion, a side of the carry portion is connected to the first bending portion, the first bending portion is connected to the first supporting portion, another side of the carry portion is connected to the second bending portion, and the second bending portion is connected to the second supporting portion;
wherein the first supporting portion and the second supporting portion are partially overlapped with the carry portion respectively; and
wherein the light-emitting diode substrate is disposed between two adjacent display panels, the first supporting portion of the light-emitting diode substrate is disposed on one of the display panels, the second supporting portion of the light-emitting diode substrate is disposed on another one of the display panels, and the carry portion of the light-emitting diode substrate is disposed on the first supporting portion and the second supporting portion and shields the gap,
wherein the spliced display panel further comprises a first colloid, a second colloid, a third colloid, and a fourth colloid, the first colloid is disposed between the carry portion and the first supporting portion, the second colloid is disposed between the carry portion and the second supporting portion, the third colloid is disposed between the first supporting portion and the display panel, and the fourth colloid is disposed between the second supporting portion and the display panel,
wherein the flexible circuit board further comprises an extension portion, the extension portion comprises a first extension portion and a second extension portion, the first extension portion is connected to the first supporting portion, the second extension portion is connected to the second supporting portion, and the first extension portion and the second extension portion are spaced from each other in the man.

11. The spliced display device according to claim 10, wherein
the spliced display panel further comprises a driving device, and the extension portion is electrically connected to the driving device.

12. The spliced display device according to claim 11, wherein
the driving device further comprises a first driving device and a second driving device, wherein the first extension portion is electrically connected to the first driving device, and the second extension portion is electrically connected to the second driving device.

13. The spliced display device according to claim 12, wherein the flexible circuit board further comprises a plurality of first traces and a plurality of second traces, and the plurality of light-emitting diodes comprises a plurality of first light-emitting diodes and a plurality of second light-emitting diodes, wherein the first traces are connected to the first light emitting diodes, and the second traces are connected to the second light emitting diodes, and
wherein the first traces extend from the carry portion to the first extension portion, and the second traces extend from the carry portion to the second extension portion.

14. The spliced display device according to claim 13, wherein the flexible circuit board further comprises a first golden finger and a second golden finger, wherein the first golden finger is positioned at a terminal of the first extension portion, the second golden finger is positioned at a terminal of the second extension portion, and wherein the first golden finger is connected to the first traces, and the second golden finger is connected to the second traces; and
wherein the first golden finger of the first extension portion is plug-fitted with the first driving device, and the second golden finger of the second extension portion is plug-fitted with the second driving device.

15. The spliced display device according to claim 11, wherein the plurality of light-emitting diodes comprise a plurality of first light-emitting diodes and a plurality of second light-emitting diodes, and the carry portion is provided with a first region and a second region, wherein the second region is disposed on both sides of the first region, the plurality of first light-emitting diodes are disposed in the first region, and the plurality of second light-emitting diodes are disposed in the second region, and
a light-emitting brightness of the first light-emitting diode is greater than a light-emitting brightness of the second light-emitting diode, and the light-emitting brightness of the second light-emitting diode is greater than a light-emitting brightness of the display panel.

16. The spliced display device according to claim 11, wherein the extension portion is connected to the first supporting portion, and the second bending portion and the second support portion are both made of non-metallic materials.

17. The spliced display device according to claim 10, wherein the display panel comprises a display region and a non-display region, and the carry portion is correspondingly disposed in the non-display region,
wherein the display panel further comprises a light-shielding layer, and the light-shielding layer is disposed in the non-display region and partially overlapped with the carry portion.

18. The spliced display device according to claim 17, wherein the display panel comprises a first substrate, a second substrate, and liquid crystal disposed between the first substrate and the second substrate, wherein the light-shielding layer is disposed between the first substrate and the second substrate and is configured to encapsulate the liquid crystal, and wherein the light-shielding layer comprises a sealant and light-shielding particles doped in the sealant.

* * * * *